(12) United States Patent
Oya et al.

(10) Patent No.: US 9,445,497 B2
(45) Date of Patent: Sep. 13, 2016

(54) SEMICONDUCTOR DEVICE

(71) Applicant: Mitsubishi Electric Corporation, Tokyo (JP)

(72) Inventors: Daisuke Oya, Tokyo (JP); Tatsuya Iwasa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/793,256

(22) Filed: Jul. 7, 2015

(65) Prior Publication Data

US 2016/0113112 A1   Apr. 21, 2016

(30) Foreign Application Priority Data

Oct. 17, 2014   (JP) .................................. 2014-212624

(51) Int. Cl.
*H05K 1/03* (2006.01)
*H05K 1/18* (2006.01)

(52) U.S. Cl.
CPC ............ *H05K 1/0306* (2013.01); *H05K 1/181* (2013.01)

(58) Field of Classification Search
CPC ........................... H05K 1/0306; H05K 1/181
USPC ........................................................ 361/783
See application file for complete search history.

(56) References Cited

U.S. PATENT DOCUMENTS

| 2002/0066953 A1 | 6/2002 | Ishiwata et al. |
| 2009/0184152 A1* | 7/2009 | Kimbara .............. B23K 1/0016 228/111 |
| 2011/0018669 A1* | 1/2011 | Ikriannikov ............ H01F 17/06 336/192 |

FOREIGN PATENT DOCUMENTS

| JP | 2000-183212 A | 6/2000 |
| JP | 2006-066595 A | 3/2006 |
| JP | 2006-319313 A | 11/2006 |
| JP | 2006-351976 A | 12/2006 |
| JP | 2012-234857 A | 11/2012 |
| JP | 2013-038344 A | 2/2013 |

\* cited by examiner

*Primary Examiner* — Yasser A Abdelaziez
(74) *Attorney, Agent, or Firm* — Studebaker & Brackett PC

(57) ABSTRACT

A semiconductor device includes a first ceramic substrate, a second ceramic substrate, an inter-ceramic metal having an intermediate portion interposed between an upper surface of the first ceramic substrate and a lower surface of the second ceramic substrate, a first surmounting portion formed on an upper surface of the second ceramic substrate, a second surmounting portion formed on the upper surface of the second ceramic substrate, a first connection portion abutting on an outer edge of the second ceramic substrate and connecting the intermediate portion and the first surmounting portion, and a second connection portion abutting on an outer edge of the second ceramic substrate and connecting the intermediate portion and the second surmounting portion, a circuit pattern formed on the second ceramic substrate, and a semiconductor element provided on the circuit pattern.

9 Claims, 7 Drawing Sheets

SEMICONDUCTOR DEVICE

BACKGROUND OF THE INVENTION

1. Field of the Invention

The present invention relates to a semiconductor device used, for example, for motor control on electric railway equipment or motor vehicle equipment.

2. Background Art

Japanese Patent Laid-Open No. 2006-66595 discloses a multilayer substrate in which a plurality of metal plates are joined together, with ceramic substrates interposed therebetween. In this multilayer substrate, a through hole in each ceramic substrate is filled with a metal to connect the metal plates on the upper and lower surfaces of the ceramic substrate to each other.

Filling the through hole in each ceramic substrate enables the metal plate (inter-ceramic metal) interposed between each adjacent pair of ceramic substrates to be used as an electrode. However, there is a problem that stress is concentrated on the periphery of the through hole in each ceramic substrate by thermal expansion or the like of the metal plates and a crack is thereby caused in the ceramic substrate. Also, breakage of the ceramic substrate can occur as a result of the growth of the crack.

SUMMARY OF THE INVENTION

In view of the above-described problem, an object of the present invention is to provide a semiconductor device capable of using an inter-ceramic metal as an electrode while inhibiting the occurrence of cracks in ceramic substrates.

The features and advantages of the present invention may be summarized as follows.

According to one aspect of the present invention, a semiconductor device includes a first ceramic substrate, a second ceramic substrate, an inter-ceramic metal having an intermediate portion interposed between an upper surface of the first ceramic substrate and a lower surface of the second ceramic substrate, a first surmounting portion formed on an upper surface of the second ceramic substrate, a second surmounting portion formed on the upper surface of the second ceramic substrate, a first connection portion abutting on an outer edge of the second ceramic substrate and connecting the intermediate portion and the first surmounting portion, and a second connection portion abutting on an outer edge of the second ceramic substrate and connecting the intermediate portion and the second surmounting portion, a circuit pattern formed of a metal on the second ceramic substrate, and a semiconductor element provided on the circuit pattern, wherein a current flowing through the semiconductor element flows through the inter-ceramic metal.

According to another aspect of the present invention, a semiconductor device includes a first ceramic substrate, a second ceramic substrate, an inter-ceramic metal having an intermediate portion interposed between an upper surface of the first ceramic substrate and a lower surface of the second ceramic substrate, a first outer edge portion extending outward beyond an outer edge of the second ceramic substrate as viewed in plan, the first outer edge portion being connected to the intermediate portion, and a second outer edge portion extending outward beyond an outer edge of the second ceramic substrate as viewed in plan, the second outer edge portion being connected to the intermediate portion, a circuit pattern formed of a metal on the second ceramic substrate, a semiconductor element provided on the circuit pattern, a first conductor electrically connecting the semiconductor element and the first outer edge portion, and a second conductor connected to the second outer edge portion.

According to another aspect of the present invention, a semiconductor device includes a first ceramic substrate, a second ceramic substrate, an inter-ceramic metal having an intermediate portion interposed between an upper surface of the first ceramic substrate and a lower surface of the second ceramic substrate, a surmounting portion formed on an upper surface of the second ceramic substrate, a connection portion abutting on an outer edge of the second ceramic substrate and connecting the intermediate portion and the surmounting portion, and an outer edge portion extending outward beyond an outer edge of the second ceramic substrate as viewed in plan, the outer edge portion being connected to the intermediate portion, a circuit pattern formed of a metal on the second ceramic substrate, a semiconductor element provided on the circuit pattern, a first conductor electrically connecting the semiconductor element and one of the surmounting portion and the outer edge portion, and a second conductor connected to the other of the surmounting portion and the outer edge portion.

Other and further objects, features and advantages of the invention will appear more fully from the following description.

DETAILED DESCRIPTION OF THE PREFERRED EMBODIMENTS

Figure 1:
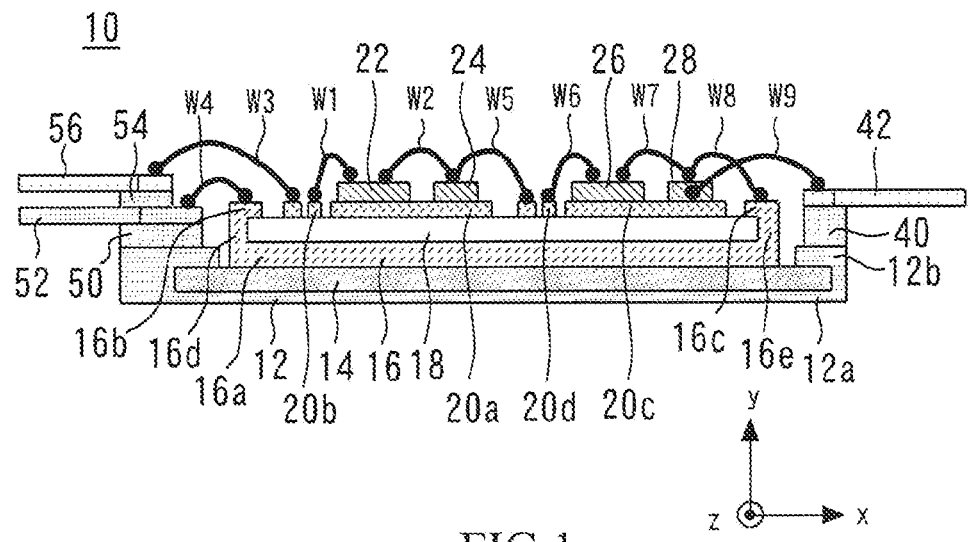
FIG. 1 is a sectional view of a semiconductor device according to a first embodiment.

Semiconductor devices according to embodiments of the present invention will be described with reference to the accompanying drawings. Components identical or corresponding to each other are indicated by the same reference characters and repeated description of them is avoided in some cases.

First Embodiment

FIG. 1 is a sectional view of a semiconductor device 10 according to a first embodiment of the present invention.

The semiconductor device 10 is provided with a base plate 12 formed of a metal such as Al or Cu in order to improve the effect of dissipating heat from the semiconductor device 10. A first ceramic substrate 14 is provided above the base plate 12. A second ceramic substrate 18 is provided above the first ceramic substrate 14. Each of the first ceramic substrate 14 and the second ceramic substrate 18 is formed, for example, of AlN, SiN or $Al_2O_3$.

An inter-ceramic metal 16 is formed between the first ceramic substrate 14 and the second ceramic substrate 18. The inter-ceramic metal 16 is formed of a metal such as Al or Cu. The inter-ceramic metal 16 is formed on an upper surface side of the first ceramic substrate 14 and the base plate 12 is formed on a lower surface side of the first ceramic substrate 14, thereby striking a balance between thermal expansions in upper and lower surfaces of the first ceramic substrate 14.

The inter-ceramic metal 16 has an intermediate portion 16a, a first surmounting portion 16b, a second surmounting portion 16c, a first connection portion 16d and a second connection portion 16e. The intermediate portion 16a is interposed between the upper surface of the first ceramic substrate 14 and a lower surface of the second ceramic substrate 18. The first surmounting portion 16b and the second surmounting portion 16c are formed on an upper surface of the second ceramic substrate 18.

The first connection portion 16d abuts on an outer edge of the second ceramic substrate 18 and is connected between the intermediate portion 16a and the first surmounting portion 16b. The second connection portion 16e abuts on another outer edge of the second ceramic substrate 18 and is connected between the intermediate portion 16a and the second surmounting portion 16c.

On the second ceramic substrate 18, circuit patterns 20a, 20b, 20c, and 20d are formed of a metal such as Al or Cu. Semiconductor elements 22 and 24 are provided on the circuit pattern 20a. Semiconductor elements 26 and 28 are provided on the circuit pattern 20c. Each of the semiconductor elements 22 and 26 is an insulated gate bipolar transistor (IGBT). Each of the semiconductor elements 24 and 28 is a diode having an anode in its upper surface and a cathode in its lower surface.

The base plate 12 has a flat portion 12a which abuts on the lower surface of the first ceramic substrate 14 and a thick film portion 12b which abuts on the flat portion 12a. The thick film portion 12b is a portion which abuts on an outer edge and the upper surface of the first ceramic substrate 14, and which surrounds the flat portion 12a as viewed in plan. An AC terminal 42 is provided on the thick film portion 12b, with an insulating film 40 interposed therebetween. An emitter terminal 52 (N terminal) is also provided on the thick film portion 12b, with an insulating film 50 interposed therebetween. A collector terminal 56 (P terminal) is provided on the emitter terminal 52, with an insulating film 54 interposed therebetween. The AC terminal 42, the emitter terminal 52 and the collector terminal 56 are terminals extending out of the semiconductor device 10.

A wire W1 connects the gate of the semiconductor element 22 and the circuit pattern 20b. A wire W2 connects the emitter of the semiconductor element 22 and the anode of the semiconductor element 24. A wire W3 connects the circuit pattern 20a and the collector terminal 56. A wire W4 connects the first surmounting portion 16b and the emitter terminal 52.

A wire W5 connects the anode of the semiconductor element 24 and the circuit pattern 20c. A wire W6 connects the circuit pattern 20d and the gate of the semiconductor element 26. A wire W7 connects the emitter of the semiconductor element 26 and the anode of the semiconductor element 28. A wire W8 connects the anode of the semiconductor element 28 and the second surmounting portion 16c. A wire W9 connects the circuit pattern 20c and the AC terminal 42.

The connection between the semiconductor element 28 and the second surmounting portion 16c by the wire W8 and the connection between the first surmounting portion 16b and the emitter terminal 52 by the wire W4 enable a current flowing through the semiconductor element to flow through the inter-ceramic metal 16. More specifically, the emitter current of the semiconductor element 26 flows through the inter-ceramic metal 16.

Figure 2:
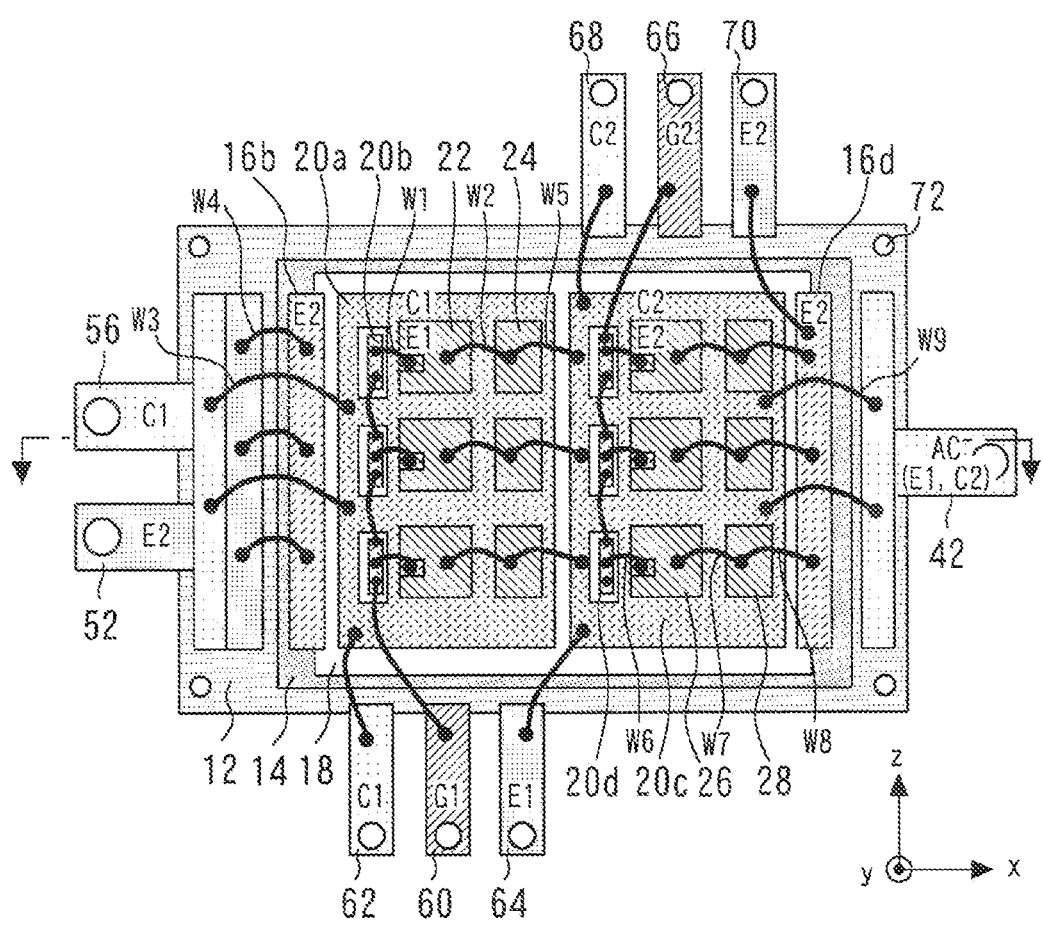
FIG. 2 is a plan view of the semiconductor device.

FIG. 2 is a plan view of the semiconductor device 10. The emitter terminal 52 is provided adjacent to the collector terminal 56, and these terminals are disposed parallel to each other in such a structure that the wiring inductance is reduced. The collector terminal 56 and the emitter terminal 52 extend in the x-negative direction from the left outer edge of the base plate 12. The AC terminal 42 extends in the x-positive direction from the right outer edge of the base plate 12.

A gate terminal 60 for supplying a gate drive signal to the gate of the semiconductor element 22 is fixed on the base plate 12. Sense terminals 62 and 64 are also fixed on the base plate 12. A gate terminal 66 for supplying a gate drive signal to the gate of the semiconductor element 26 is fixed on the base plate 12. Sense terminals 68 and 70 are also fixed on the base plate 12.

Through holes 72 are provided in four corner portions in the base plate 12. When the semiconductor device 10 is used, the semiconductor device 10 is fixed on a heat sink or the like with screws passed through the through holes 72. Preferably, at this time, heat sink grease is provided between the lower surface of the base plate 12 and the heat sink or the like. FIG. 1 is a sectional view taken along the line indicated by arrows in FIG. 2.

Figure 3:
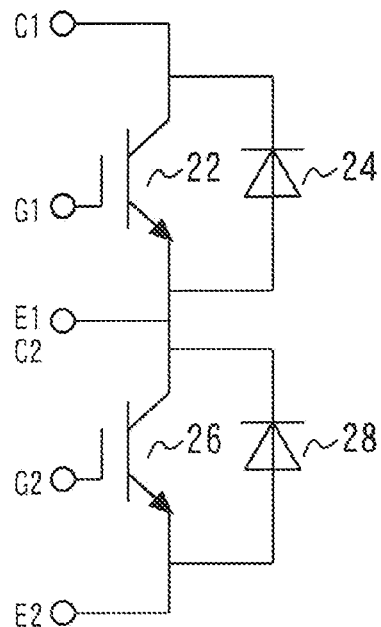
FIG. 3 is a circuit diagram of the semiconductor device.

FIG. 3 is a circuit diagram of the semiconductor device 10. The semiconductor device 10 forms one leg of a three-phase alternating-current inverter. Portions indicated by C1, G1, E1, C2, G2, and E2 in FIG. 3 correspond to portions indicated by C1, G1, E1, C2, G2, and E2 in FIG. 2.

A method of manufacturing the semiconductor device 10 will subsequently be described. The multilayer substrate of the semiconductor device 10 is formed by a molten metal joining process, which is a process for directly joining a metal and ceramic substrate to each other. In the molten metal joining process, ceramic substrates are set in a mold and a molten metal is poured into the mold. More specifically, a molten metal is poured into a mold in which the first ceramic substrate 14 and the second ceramic substrate 18 are set, thereby forming the base plate 12, the inter-ceramic metal 16 and the circuit patterns 20a, 20b, 20c, and 20d at a time. The semiconductor elements are thereafter fixed on the circuit patterns and wire bonding is performed thereon, thereby completing the semiconductor device 10. This method enables the first surmounting portion 16b, the second surmounting portion 16c, the first connection portion 16d and the second connection portion 16e to be formed by simply adjusting the shape of the mold.

The multilayer substrate of the semiconductor device 10 may be manufactured by an active metal joining process, which is a process for joining a metal and a ceramic substrate with an indirect material such as a brazing material. In the case where the multilayer substrate is formed by using the molten metal joining process or the active metal joining process, the effect of dissipating heat from the semiconductor device can be improved since solder is not used for joining between the ceramic substrates and the metal. Also, the assembly process can be simplified in comparison with the case where component parts are joined with solder.

In order to reduce the wiring inductance, it is preferable to dispose the collector terminal (P terminal) and the emitter terminal (N terminal) adjacent and parallel to each other. With realization of this with the arrangement in which currents are caused to flow only on the second ceramic substrate 18, however, there has been a problem that the shapes of the terminals are complicated and the semiconductor device is increased in size. More specifically, it is necessary to provide a large terminal for connecting the emitter of the semiconductor element 26 and the anode of the semiconductor element 28 to the emitter terminal 52 and to increase the size of the emitter terminal 52.

In the semiconductor device according to the first embodiment of the present invention, however, the emitter of the semiconductor element 26 and the anode of the semiconductor element 28 are connected to the emitter terminal 52 through the inter-ceramic metal 16. Therefore, a markedly simple terminal shape can be realized, as shown in FIG. 2. By using the inter-ceramic metal 16 as an electrode, a new current path can be provided below the second ceramic substrate 18.

Moreover, since the inter-ceramic metal 16 has portions (first connection portion 16d and second connection portion 16e) which abut on the outer edge of the second ceramic substrate 18, the inter-ceramic metal 16 can be used as an electrode without providing any hole in the second ceramic substrate 18. Thus, use of the inter-ceramic metal 16 as an electrode is enabled while the occurrence of a crack from a hole in the ceramic substrate is inhibited.

The semiconductor device according to the first embodiment of the present invention can be variously modified within such a scope that its features are not lost. For example, while the emitter current of the IGBT (semiconductor element 26) is caused to flow through the inter-ceramic metal 16 in the first embodiment, the collector current may alternatively be caused to flow through the inter-ceramic metal or an AC current (output current) may be caused to flow through the inter-ceramic metal. Use of the inter-ceramic metal as a current path enables simplification of the electrical connection of the semiconductor device. Also, a plurality of inter-ceramic metals may be provided below one ceramic substrate to provide a plurality of current paths. The semiconductor elements 22, 24, 26, and 28 are not limited to IGBTs or diodes. For example, a MOSFET may be used as a semiconductor element. The necessary electrical connections may be made by using electrically conductive members such as electrodes in place of the wires.

Figure 4:
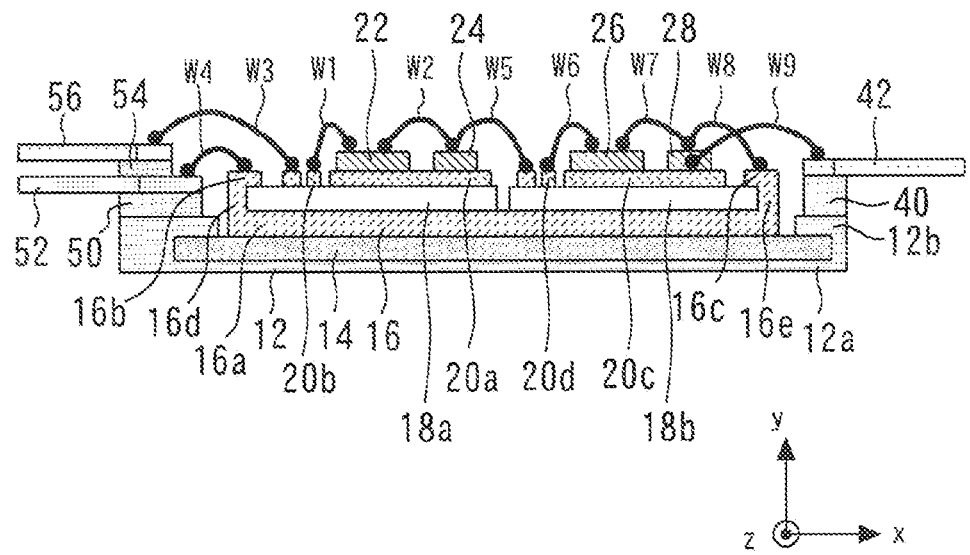
FIG. 4 is a sectional view of a semiconductor device according to a modified example.

FIG. 4 is a sectional view of a semiconductor device according to a modified example. Second ceramic substrates 18a and 18b are provided on the inter-ceramic metal 16. That is, a plurality of second ceramic substrates are provided.

If the size of the ceramic substrate is increased, the ceramic substrate can break more easily by being largely influenced by thermal stress from the metal that abuts on the ceramic substrate. However, the size of the second ceramic substrate per piece can be reduced by dividing the second ceramic substrate into a plurality of pieces, thus enabling prevention of breakage of the second ceramic substrate.

These modifications can be applied as desired to the semiconductor devices according to the embodiments described below. Each of the semiconductor devices according to the embodiments described below has a number of commonalities with the semiconductor device according to the first embodiment and will therefore be described with respect to points of difference from the first embodiment.

Second Embodiment

Figure 5:
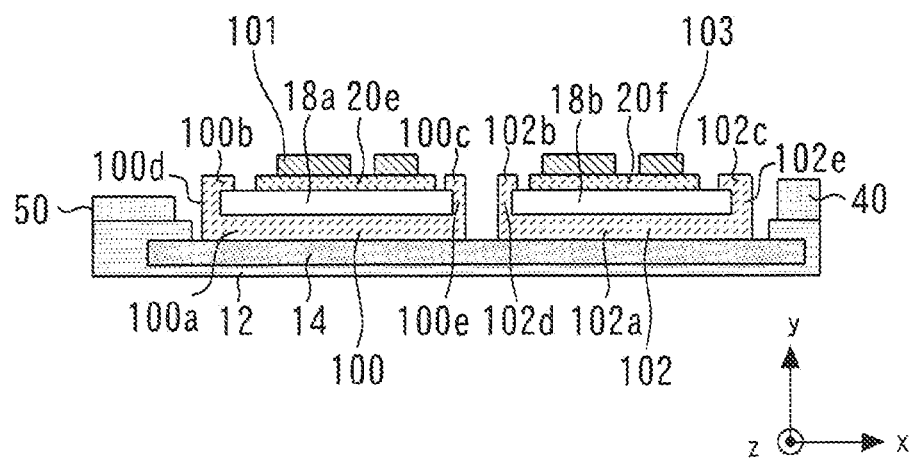
FIG. 5 is a sectional view of the semiconductor device according to the second embodiment.

FIG. 5 is a sectional view of the semiconductor device according to the second embodiment. This semiconductor device has two second ceramic substrates 18a and 18b and two inter-ceramic metals 100 and 102. The inter-ceramic metal 100 has an intermediate portion 100a, a first surmounting portion 100b, a second surmounting portion 100c, a first connection portion 100d and a second connection portion 100e. The inter-ceramic metal 102 has an intermediate portion 102a, a first surmounting portion 102b, a second surmounting portion 102c, a first connection portion 102d and a second connection portion 102e.

A semiconductor element 101 is fixed on a circuit pattern 20e on the second ceramic substrate 18a. The semiconductor element 101 is an element necessary for forming a converter circuit. A semiconductor element 103 is fixed on a circuit pattern 20f on the second ceramic substrate 18b. The semiconductor element 103 is an element necessary for forming an inverter circuit. That is, the semiconductor elements in the second embodiment constitute a converter circuit and an inverter circuit. Wires and terminals are omitted in the illustration.

In the semiconductor device according to the second embodiment of the present invention, the inter-ceramic metal 100 can be used as an electrode for a converter circuit and the inter-ceramic metal 102 can be used as an electrode for an inverter circuit. Thus, while a converter circuit and an inverter circuit are mixedly mounted, current paths can be newly provided for these circuits.

In the second embodiment of the present invention, a converter circuit and an inverter circuit are provided on the separate second ceramic substrates. However, two or more circuits differing in function from each other, not limited to a converter circuit and an inverter circuit, may be mounted. The number of inter-ceramic metals is not limited to two. A plurality of current paths can be provided by forming a plurality of inter-ceramic metals.

Figure 6:
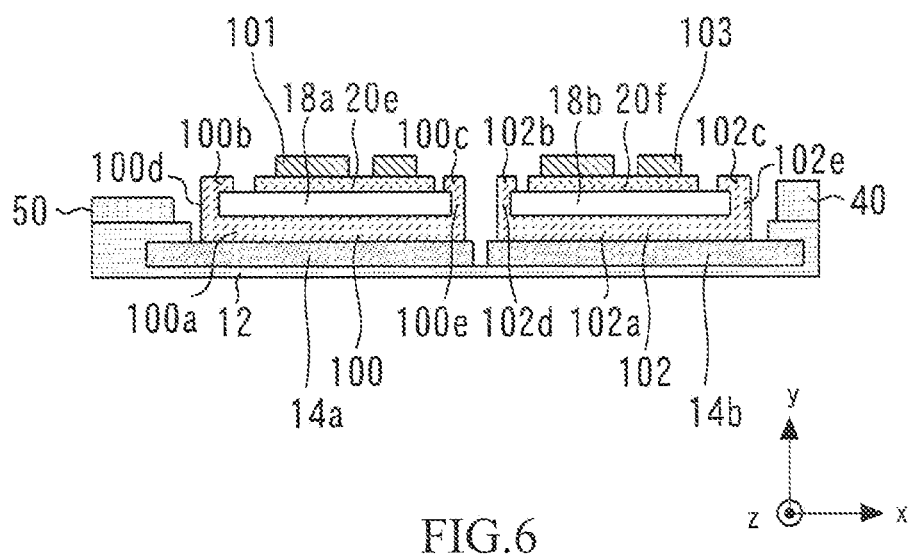
FIG. 6 is a sectional view of a semiconductor device according to a modified example.

FIG. 6 is a sectional view of a semiconductor device according to a modified example. This semiconductor device has two first ceramic substrates 14a and 14b. Each of the first ceramic substrates 14a and 14b can thereby be reduced in size and can therefore be made not easily breakable. The above-described effect can be obtained if a plurality of first ceramic substrates are provided. Therefore, three or more first ceramic substrates may be provided.

Third Embodiment

Figure 7:
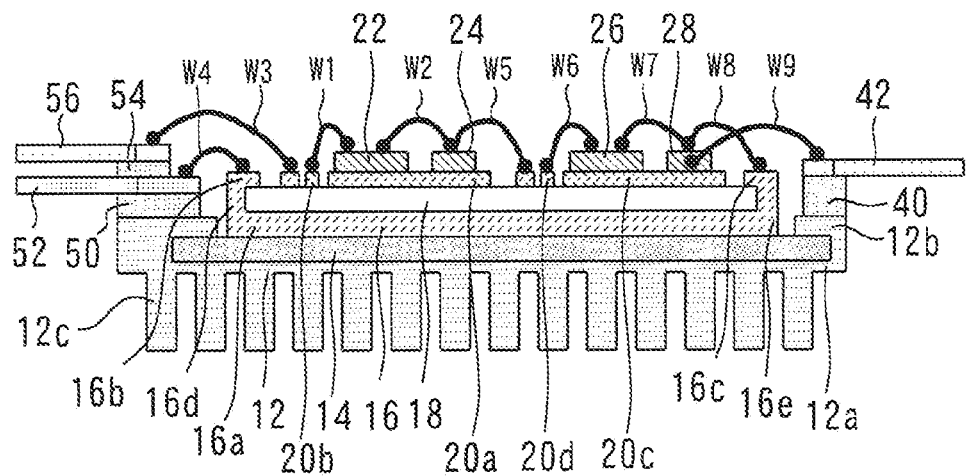
FIG. 7 is a sectional view of the semiconductor device according to the third embodiment.

FIG. 7 is a sectional view of the semiconductor device according to the third embodiment. Heat sink fins 12c are formed on the base plate 12 made of a metal on the lower surface of the first ceramic substrate 14. The heat sink fins 12c can easily be formed by simply modifying the shape of the mold for forming the base plate 12, the inter-ceramic metal 16 and the circuit patterns 20a, 20b, 20c, and 20d. The provision of the heat sink fins 12c on the base plate 12 eliminates the need for fixing the semiconductor device on a heat sink or the like.

Fourth Embodiment

Figure 8:
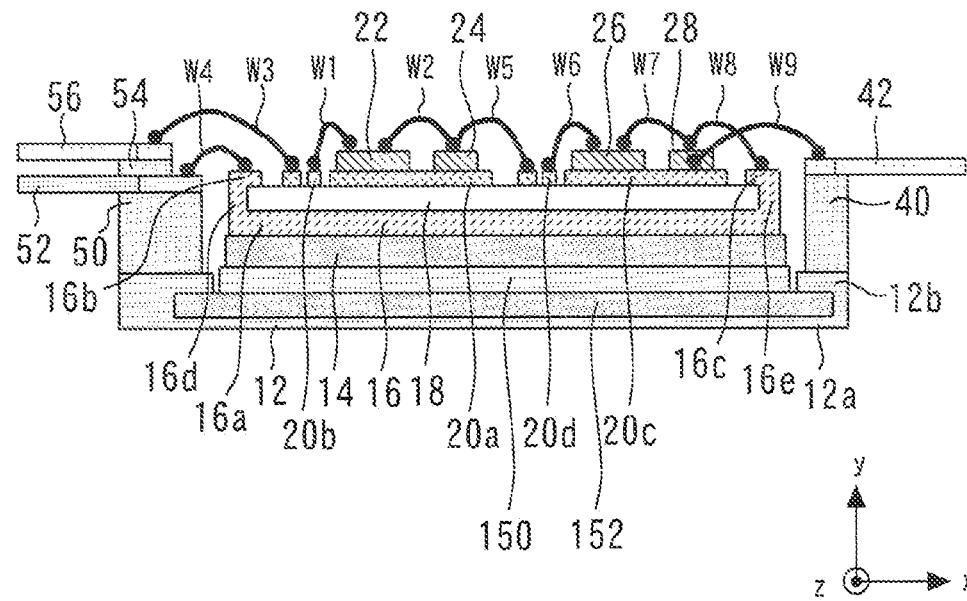
FIG. 8 is a sectional view of the semiconductor device according to the fourth embodiment.

FIG. 8 is a sectional view of the semiconductor device according to the fourth embodiment. A metal layer 150 is formed on the lower surface of the first ceramic substrate 14. A third ceramic substrate 152 is formed on a lower surface of the metal layer 150. The base plate 12 is formed of a metal on a lower surface of the third ceramic substrate 152.

The semiconductor device according to the fourth embodiment has three ceramic substrates and can therefore has a higher withstand voltage than those having only two ceramic substrates. Also, the provision of the metal layer 150 as a floating electrode enables inhibition of electric discharge which can occur between the inter-ceramic metal 16 and the base plate 12.

Fifth Embodiment

Figure 9:
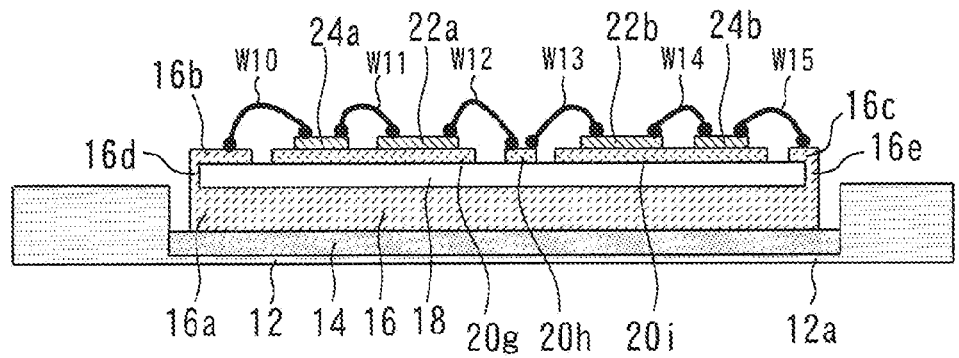
FIG. 9 is a sectional view of the semiconductor device according to the fifth embodiment.

FIG. 9 is a sectional view of the semiconductor device according to the fifth embodiment. This semiconductor device constitutes one arm of an inverter circuit (a switching element and a diode connected in inverse parallel with the switching element).

Three circuit patterns 20g, 20h, and 20i are formed on the upper surface of the second ceramic substrate 18. Semiconductor elements 22a and 24a are fixed on the circuit pattern 20g. Semiconductor elements 22b and 24b are fixed on the circuit pattern 20i.

A wire W10 connects the first surmounting portion 16b and the anode of the semiconductor element 24a. A wire W11 connects the anode of the semiconductor element 24a and the emitter of the semiconductor element 22a. A wire W12 connects the gate of the semiconductor element 22a and the circuit pattern 20h. A wire W13 connects the circuit pattern 20h and the gate of the semiconductor element 22b. A wire W14 connects the emitter of the semiconductor element 22b and the anode of the semiconductor element 24b. A wire W15 connects the anode of the semiconductor element 24b and the second surmounting portion 16c.

Figure 10:
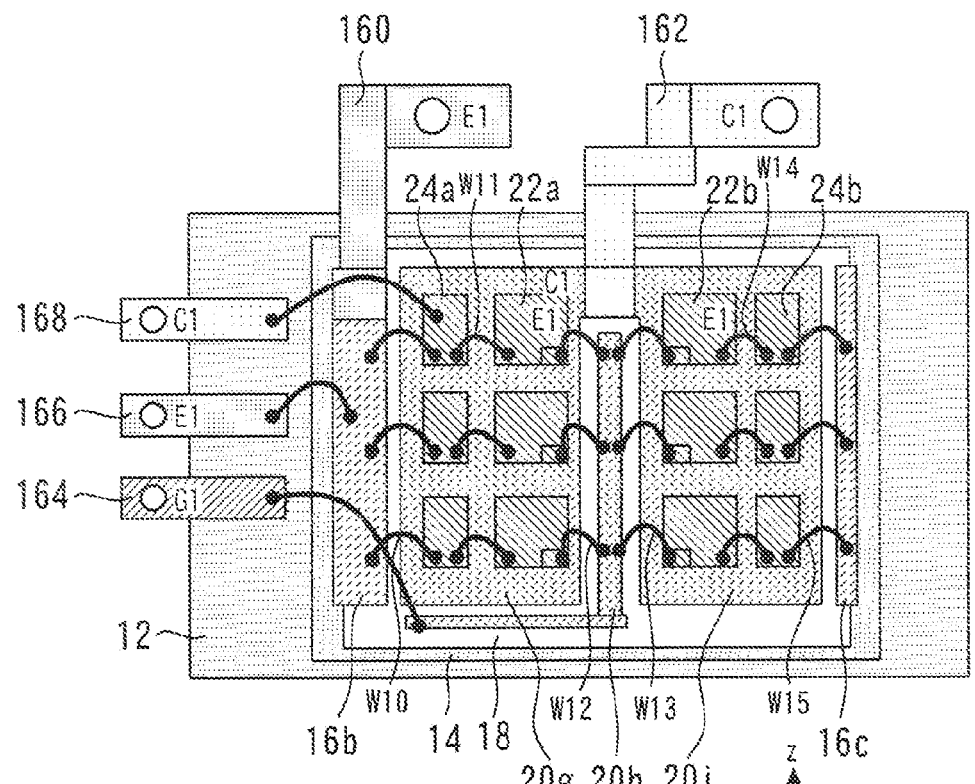
FIG. 10 is a plan view of the semiconductor device according to the fifth embodiment.

FIG. 10 is a plan view of the semiconductor device according to the fifth embodiment. An emitter terminal 160 is connected to the first surmounting portion 16b and extends in the z-positive direction from the upper outer edge of the base plate 12. The circuit pattern 20g and the circuit pattern 20i are connected to form one circuit pattern. A collector terminal 162 is connected to the circuit patterns 20g and 20i and extends in the z-positive direction from the upper outer edge of the base plate 12. The emitter terminal 160 is provided adjacent to the collector terminal 162 and these terminals are disposed parallel to each other.

A gate terminal 164 is connected to the circuit pattern 20h. Sense terminals 166 and 168 are connected to the first surmounting portion 16b and the anode of the semiconductor element 24a, respectively.

Figure 11:
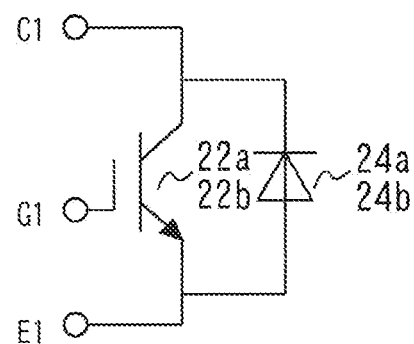
FIG. 11 is a circuit diagram of the semiconductor device according to the fifth embodiment.

FIG. 11 is a circuit diagram of the semiconductor device according to the fifth embodiment. Portions indicated by C1, G1, and E1 in FIG. 11 correspond to portions indicated by C1, G1, and E1 in FIG. 10. In FIG. 11, the three semiconductor elements 22a and the three semiconductor elements 22b in FIG. 10 are represented by one switching element (IGBT), and the three semiconductor elements 24a and the three semiconductor elements 24b in FIG. 10 are represented by one semiconductor element (diode).

In the semiconductor device according to the fifth embodiment, the emitter current of the semiconductor element 22b flows from the second surmounting portion 16c to the first surmounting portion 16b via the intermediate portion 16a, as shown in FIG. 9. The connection of the emitter of the semiconductor element 22b to the first surmounting portion 16b enables the entire emitter current to flow through the first surmounting portion 16b. The shape of the emitter terminal 160 can therefore be simplified. Completing the wiring only on the second ceramic substrate without using the inter-ceramic metal as an electrode, if possible, requires connecting the emitter terminal to the emitter of the semiconductor element 22a and to the emitter of the semiconductor element 22b separately and, hence, forming the emitter terminal into a complicated shape.

The semiconductor device according to the fifth embodiment arranged to constitute one arm may alternatively be arranged to constitute a different circuit. The degree of freedom of wiring can be increased when the inter-ceramic metal is used as an electrode so that a current is caused to flow below the second ceramic substrate, thus enabling optimization of the terminal shape and the terminal layout.

Sixth Embodiment

Figure 12:
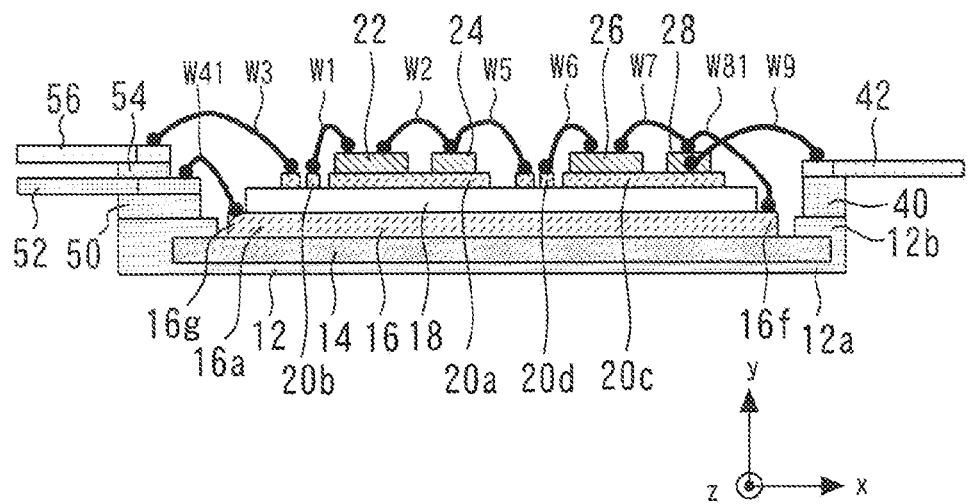
FIG. 12 is a sectional view of the semiconductor device according to the sixth embodiment.

FIG. 12 is a sectional view of the semiconductor device according to the sixth embodiment. The inter-ceramic metal 16 has a first outer edge portion 16f and a second outer edge portion 16g. The first outer edge portion 16f and the second outer edge portion 16g extend outward beyond the outer edge of the second ceramic substrate 18 as viewed in plan. The first outer edge portion 16f and the second outer edge portion 16g are connected to the intermediate portion 16a. The second ceramic substrate 18 is interposed between the first outer edge portion 16f and the second outer edge portion 16g as viewed in plan.

A first conductor W81 electrically connects the anode of the semiconductor element 28 and the first outer edge portion 16f. One end of a second conductor W41 is connected to the second outer edge portion 16g while the other end of the second conductor W41 is connected to the emitter terminal 52. Each of the first conductor W81 and the second conductor W41 is a wire.

Connecting the first conductor W81 and the second conductor W41 to the inter-ceramic metal 16 in this way enables the inter-ceramic metal 16 to be used as an electrode. In comparison with the semiconductor device in the first embodiment, the surmounting portions and the connection portions of the inter-ceramic metal can be removed and, therefore, the structure can be simplified. On the other hand, it is necessary that the first outer edge portion 16f and the second outer edge portion 16g have sufficient areas for bonding of wires. There is, therefore, a possibility of the semiconductor device according to the sixth embodiment becoming slightly larger than the semiconductor device according to the first embodiment. The first conductor W81 and the second conductor W41 may alternatively be electrodes or the like different from wires.

Seventh Embodiment

Figure 13:
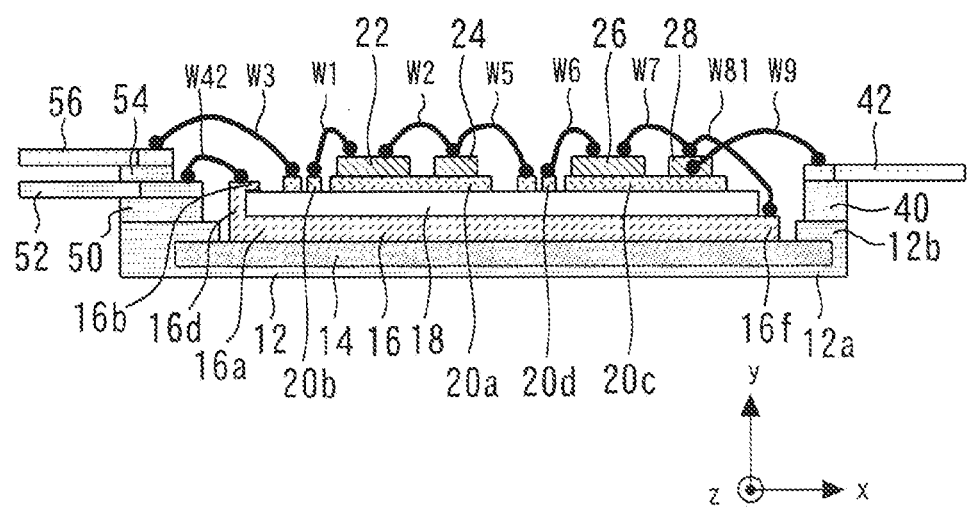
FIG. 13 is a sectional view of the semiconductor device according to the seventh embodiment.

FIG. 13 is a sectional view of the semiconductor device according to the seventh embodiment. The inter-ceramic metal 16 has the first outer edge portion 16f, the first surmounting portion 16b and the first connection portion 16d. The first conductor W81 connects the first outer edge portion 16f and the semiconductor element 28. A second conductor W42 connects the first surmounting portion 16b and the emitter terminal 52. The emitter current of the semiconductor element 26 flows from the first outer edge portion 16f to the first surmounting portion 16b via the intermediate portion 16a and the first connection portion 16d.

The seventh embodiment of the present invention presupposes a situation where a space for bonding of wires can easily be secured in a right-hand region while a similar space cannot easily be secured in a left-hand region. In such a case, the first outer edge portion is formed in a right-hand region and the first surmounting portion is formed on a left-hand region, thereby enabling reliable wire bonding.

The inter-ceramic metal may be modified in various ways as long as it has the surmounting portion on the upper surface of the second ceramic substrate, the connection portion abutting on the outer edge of the second ceramic substrate and connecting the intermediate portion and the surmounting portion, and the outer edge portion extending outward beyond the outer edge of the second ceramic substrate as viewed in plan and connected to the intermediate portion. For example, the inter-ceramic metal 16 in FIG. 13 may alternatively have a surmounting portion formed on the right-hand side and an outer edge portion formed on the left-hand side. The first conductor W81 electrically connects the semiconductor element and one of the surmounting portion and the outer edge portion. The second conductor W42 is connected to the other of the surmounting portion and the outer edge portion. The first conductor W81 and the second conductor W42 may alternatively be electrodes or the like different from wires. A combination of some of the embodiments described above may be made and used as desired.

According to the present invention, no through holes are formed in the ceramic substrates and an electrical connection is established at an outer edge of the inter-ceramic metal, thereby enabling the inter-ceramic metal to be used as an electrode while inhibiting the occurrence of cracks in the ceramic substrates.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a first ceramic substrate;
   a second ceramic substrate;
   an inter-ceramic metal having an intermediate portion interposed between an upper surface of the first ceramic substrate and a lower surface of the second ceramic substrate, a first surmounting portion formed on an upper surface of the second ceramic substrate, a second surmounting portion formed on the upper surface of the second ceramic substrate, a first connection portion abutting on an outer edge of the second ceramic substrate and connecting the intermediate portion and the first surmounting portion, and a second connection portion abutting on an outer edge of the second ceramic substrate and connecting the intermediate portion and the second surmounting portion;
   a circuit pattern formed of a metal on the second ceramic substrate; and
   a semiconductor element provided on the circuit pattern, wherein a current flowing through the semiconductor element flows through the inter-ceramic metal.

2. A semiconductor device comprising:
   a first ceramic substrate;
   a second ceramic substrate;
   an inter-ceramic metal having an intermediate portion interposed between an upper surface of the first ceramic substrate and a lower surface of the second ceramic substrate, a surmounting portion formed on an upper surface of the second ceramic substrate, a connection portion abutting on an outer edge of the second ceramic substrate and connecting the intermediate portion and the surmounting portion, and an outer edge portion extending outward beyond an outer edge of the second ceramic substrate as viewed in plan, the outer edge portion being connected to the intermediate portion;
   a circuit pattern formed of a metal on the second ceramic substrate;
   a semiconductor element provided on the circuit pattern;
   a first conductor electrically connecting the semiconductor element and one of the surmounting portion and the outer edge portion; and
   a second conductor connected to the other of the surmounting portion and the outer edge portion.

3. The semiconductor device according to claim 1, further comprising:
   a collector terminal; and
   an emitter terminal provided adjacent to the collector terminal,
   wherein a collector current or an emitter current of the semiconductor element flows through the inter-ceramic metal, and
   wherein the collector terminal and the emitter terminal are disposed parallel to each other.

4. The semiconductor device according to claim 1, comprising a plurality of the second ceramic substrates.

5. The semiconductor device according to claim 1, comprising a plurality of the inter-ceramic metals.

6. The semiconductor device according to claim 1, comprising a plurality of the first ceramic substrates.

7. The semiconductor device according to claim 4, wherein the semiconductor elements constitute a converter circuit and an inverter circuit, and wherein the converter circuit and the inverter circuit are provided on separate ones of the second ceramic substrates.

8. The semiconductor device according to claim 1, further comprising a base plate formed of a metal on a lower surface of the first ceramic substrate,
   wherein heat sink fins are formed on the base plate.

9. The semiconductor device according to claim 1, further comprising:
   a metal layer formed on a lower surface of the first ceramic substrate;
   a third ceramic substrate formed on a lower surface of the metal layer; and
   a base plate formed of a metal on a lower surface of the third ceramic substrate.

* * * * *